United States Patent [19]

Shatas et al.

[11] Patent Number: 5,323,298

[45] Date of Patent: Jun. 21, 1994

[54] INTEGRAL ENCLOSURE AND SHIELD FOR EMI RADIATING CIRCUITRY

[76] Inventors: Remigius G. Shatas, 2712 Barcody Rd., Huntsville, Ala. 35801; Steven F. Brown, 3105 Thurman Rd., Apt. K-23, Huntsville, Ala. 35805

[21] Appl. No.: 912,769

[22] Filed: Jul. 13, 1992

[51] Int. Cl.$^5$ .............................................. H05K 9/00
[52] U.S. Cl. .................. 361/816; 174/35 R
[58] Field of Search .......... 174/35 R, 35 MS, 35 GC, 174/35 TS; 361/424, 818; 329/318, 349; 330/68; 315/85; 307/91; 333/12; 331/67; 336/84 R, 84 C; 439/607–610; 343/841; 358/255; 338/64; 334/85; 250/505.1, 506.1, 507.1, 515.1, 517.1, 519.1

[56] References Cited

U.S. PATENT DOCUMENTS 2,798,781 7/1957 Anderson .
4,386,388 5/1983 Beun .................................. 174/35 R
4,713,633 12/1987 Saito et al. ........................... 361/424

*Primary Examiner*—Leo P. Picard
*Assistant Examiner*—Bot Ledinh
*Attorney, Agent, or Firm*—Phillips & Beumer

[57] ABSTRACT

An enclosure is constructed of electromagnetic radiation shielding material for housing and supporting circuitry that emits electromagnetic interference. Symmetrical top and bottom covers are fabricated of a generally U-shaped configuration, with a downwardly extending tab on one side region of the upper cover and an upwardly extending tab on an opposite side region of the lower cover, these tabs for covering a butt joint between the upper and lower covers. Symmetrical front and rear covers are each constructed having inwardly extending sides also for covering the butt joints, with a lip on each of these side regions. Slots in these lips support circuit boards in the enclosure. Segmented lips on upper and lower sides of the front and rear covers contact upper and lower regions of the upper and lower covers. Constructed as such, there are no significant gaps in the enclosure to radiate electromagnetic radiation.

11 Claims, 2 Drawing Sheets

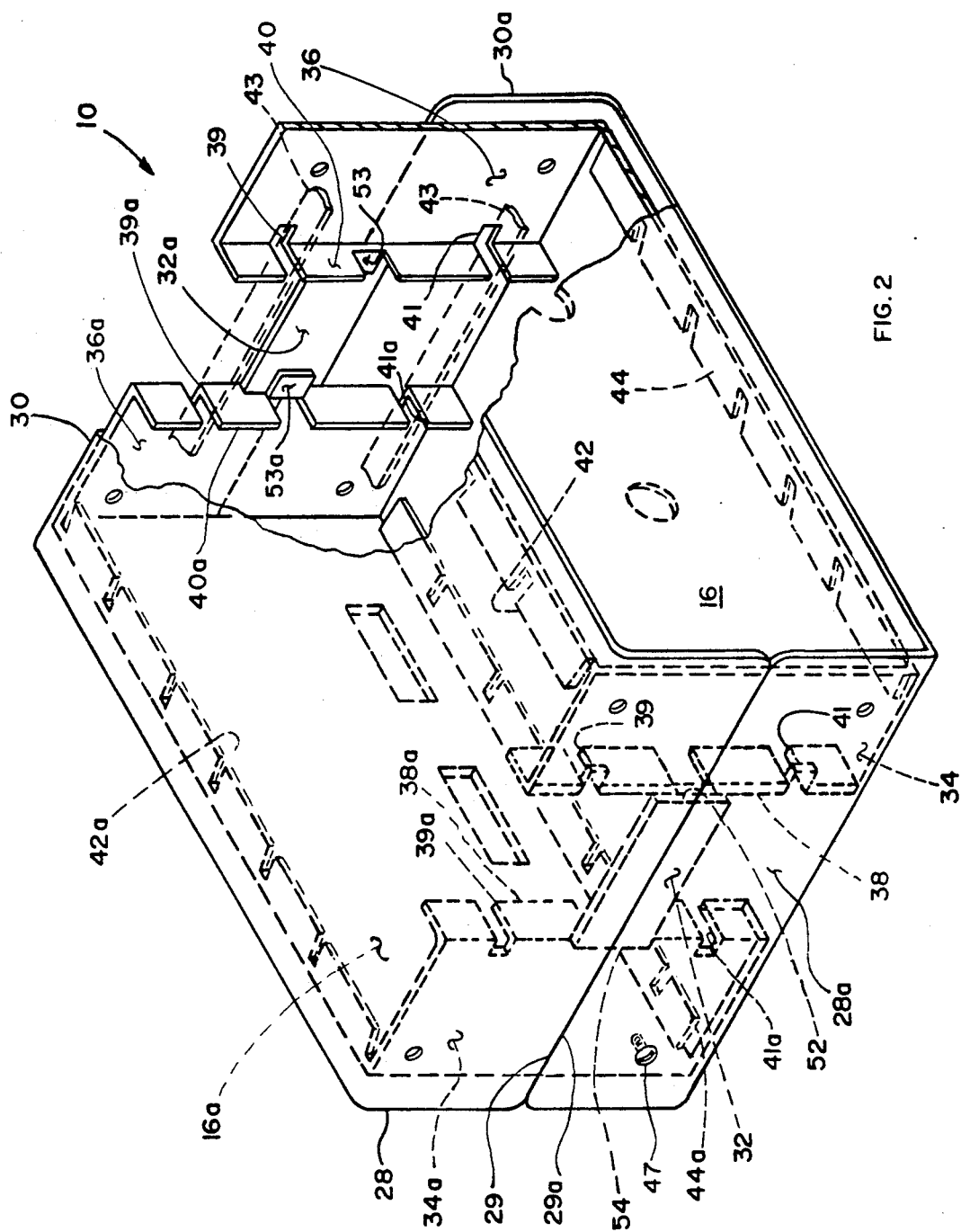

INTEGRAL ENCLOSURE AND SHIELD FOR EMI RADIATING CIRCUITRY

FIELD OF THE INVENTION

This invention relates generally to enclosures for containing and supporting electronic circuitry and particularly to an integral electronic enclosure and shield wherein the enclosure is constructed to provide excellent protection against leakage of electromagnetic radiation emanating from the circuitry, eliminating the need for discrete electromagnetic interference shielding around circuitry within the enclosure.

BACKGROUND OF THE INVENTION

In the use of high-speed digital circuitry, such as circuitry housing computer signal conditioning equipment manufactured by Cybex Corporation of Huntsville, Ala., the signals originating in such circuitry possess extremely fast rise and fall times, generally in the single-digit nanosecond range, which tends to produce electromagnetic radiation at these frequencies. If not suppressed or blocked, this radiation is capable of producing electromagnetic interference (EMI) with television and radio communications and may further interfere with other digitally operated devices.

In an effort to prevent electromagnetic radiation leakage, manufacturers of digital and other high-speed switching equipment typically resort to enclosing the individual circuit boards which emit the offending radiation inside metallic electromagnetic interference shields, these shields in many instances being mounted and grounded directly to the circuit boards. This is done primarily because the outer enclosure housing the device and its circuit boards may not be constructed of a material suitable for blocking electromagnetic radiation or may be constructed having openings and/or slits that may pass high-frequency noise.

Examples of mounting shielding directly to a circuit board are found in U.S. Pat. Nos. 3,816,911, issued on Jun. 18, 1974, to Knappenberger; 4,386,388, issued on May 31, 1983, to Beun; and 5,014,160, issued on May 7, 1991, to McCoy. These circuit boards with shielding mounted thereto are then mounted in an outer enclosure with other components to form the completed product. In other instances, such is as found in U.S. Pat. Nos. 4,864,077, issued on Sep. 5, 1989, to Wadell; 4,300,016, issued on Nov. 10, 1981, to Bergeron et. al.; 4,661,888, issued on Apr. 28, 1987, to Jewell et. al.; and 5,034,856, issued on Jul. 23, 1991, to Cook et. al., the shielding is constructed in the form of a module within which a discrete circuit board is mounted. Here, the module is then mounted in the outer enclosure with other like-shielded modules to form the completed product.

Problems with these techniques are that the shielding, whether mounted directly to the circuit board or constructed as a module within which the circuit board is mounted, is usually of complex shapes, and in some instances is constructed from a number of asymmetrical sections that must be fitted together. In addition to increasing time required to assemble a device shielded by one of the aforementioned methods of the prior art, fabrication costs are increased due to the assymetrical nature of the discrete sections of the shielding.

Accordingly, since the applicants are unaware of any such outer enclosure that provides efficient EMI shielding, and because the outer enclosure is constructed of symmetrical sections for ease of manufacture, it is an object of this invention to provide an outer enclosure that also serves as an electromagnetic radiation shield by providing an enclosure wherein all joints are of overlapping character.

It is a further object of this invention to provide such an enclosure that is constructed of completely symmetrical components to allow for ease of construction and fabrication.

SUMMARY OF THE INVENTION

A non-radiating enclosure for housing and supporting circuitry which radiates electromagnetic interference is constructed having upper and lower symmetrical covers each provided with opposed side regions normal to upper and lower regions of the covers, with these side regions forming sides of the enclosure. Symmetrical front and back covers are each provided with side regions normal to the front and back surfaces of the covers, with support means for supporting a circuit board disposed on these side regions.

BRIEF DESCRIPTION OF THE DRAWINGS

FIG. 2 is a partially cut-away pictorial view of an assembled enclosure of the present invention showing overlapping interior joints in dotted lines.

DESCRIPTION OF THE PREFERRED EMBODIMENT

Figure 1:
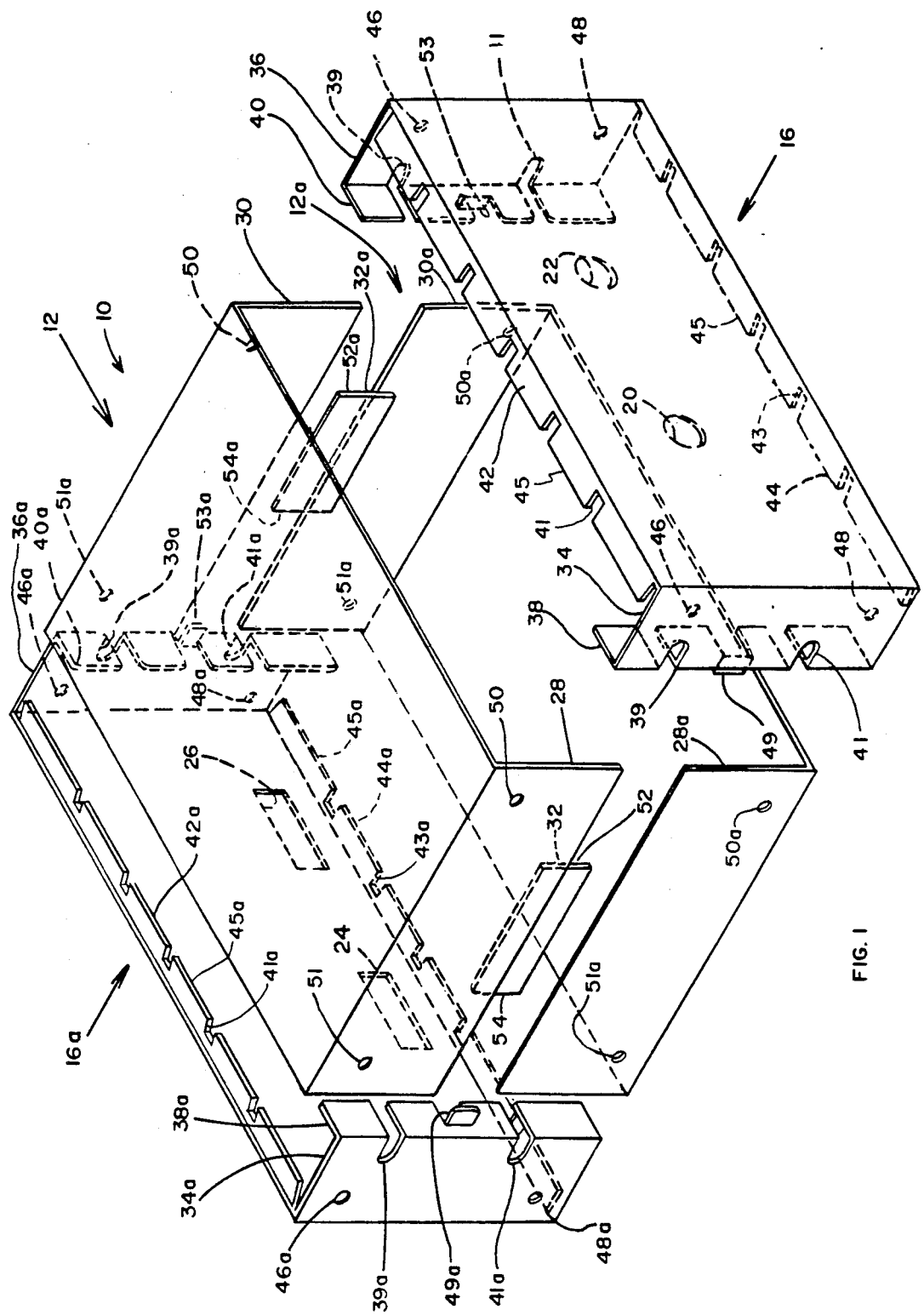
FIG. 1 is an exploded pictorial view showing construction of components of an enclosure of the present invention.

Referring initially to FIG. 1, an enclosure of the present invention is shown in exploded relation to clearly illustrate components of the invention and their interfacing surfaces. In this enclosure, the components are constructed of a suitable material so as to block electromagnetic interference (EMI) as, for example, cold rolled steel. These components are formed by conventional sheet metal fabrication equipment, as is well known in the art, and are held to tolerances of about 0.010". With this degree of relative imprecision, there are no significant radiating gaps anywhere in the enclosure, as will be further explained, and which further do not necessitate use of additional EMI gasket materials or shielding.

Considering the individual components of enclosure 10, it will be noted that top cover 12 is symmetrical to bottom cover 12a, and front 16 is symmetrical to back 16a. Accordingly, for simplicity of description, like numeral reference designations are applied to like parts, with the suffix "a" of reference numerals reserved for designations applied to bottom and back covers 12a and 16a, respectively. Openings for indicators, connectors, plugs, switches, and the like may be provided as necessary, as illustrated by dashed line openings 20, 22, 24, and 26, in any of the portions making up enclosure 10. Typically, such connectors, plugs, switches and indicators may be purchased as discretely shielded components, eliminating radiation from these components.

Top cover 12 is constructed having an inverted, generally U-shaped configuration, with downwardly depending portions 28 and 30 being normal to a top surface of top cover 12. Bottom cover 12a is similarly constructed, with upwardly depending portions 28a and 30a. Portions 28 and 30 each form a respective upper side of enclosure 10, with corresponding portions 28a and 30a of lower cover 12a forming lower sides of the enclosure. A downwardly extending tab 32 is centrally mounted on an interior side of one of side portions 28 or 30, with an upwardly extending tab 32a mounted on an interior side of one of side portions 28a and 30a of bottom cover 12a. As shown, the tab on the upper cover is positioned to extend down one side of the enclosure, while the tab on the bottom cover is positioned to extend up along the opposite side of the enclosure. Alternately, tabs 32 and 32a may be constructed integral with portions 28, 30 and 28a, 30a by bending tab 32 and 32a such that the tab regions are offset toward an inside region of the adjacent side portion.

Front 16 is also constructed of a generally U-shaped configuration and is provided with rearwardly extending regions 34 and 36 generally normal to a generally flat front surface of front cover 16. In a preferred embodiment, regions 34 and 36 extend inward a distance to cover a front portion of an interface between upwardly depending and downwardly depending regions 28a and 28, respectively, and 30a and 30, respectively. Inwardly extending lips 38 and 40 are provided as shown on ends of regions 34 and 36, with lips 38 and 40 extending inward generally normal to regions 34 and 36. If desired, small tabs 49 and 53 may be cut in lips 38 and 40 to a depth so that when tabs 49 and 53 are bent outward from lip 38 generally into planes parallel with regions 34 and 36, these tabs are positioned inboard of tabs 32 and 32a a distance corresponding to the thickness of material of tabs 32 and 32a. Slots 39 and 41 are provided in lips 38 and 40 for supporting circuit boards, as will be explained.

Front cover 16 is also provided with upper and lower lips 42 and 44, which lips extend inward toward an interior of the enclosure and further being angled outward on the order of about 2° from a plane normal to the flat front surface of cover 16. A plurality of transverse, spaced slots or kerfs 41 and 43, respectively, are cut in lips 42 and 44. These slots serve to interrupt lips 42 and 44 and create lip segments 45, which generally reduces spring tension of lips 42 and 44. Additionally, a more complete EMI seal is provided by allowing each of segments 45 to compensate for any outward bowing or other unevenness of covers 12 and 12a, ensuring that each of the segments 45 is in contact with upper or lower cover 12 or 12a.

Rear cover 16a is identically constructed having forwardly extending regions 34a and 36a, with lips 38a and 40a extending as described on end regions of regions 34a and 36a and provided with tabs 49a and 53a. Slots 39a and 41a in lips 38a and 40a are horizontally aligned with slots 39 and 41 such that circuit boards supported by each respective set of horizontally aligned slots are generally parallel with the top and bottom covers. Angled, segmented lips 42a and 44a are provided on upper and lower edges of rear cover 16a, as described for front cover 16. Alternately, plates 52 and 52a may be omitted, and regions 34, 34a and 36, 36a may be constructed so as to each extend further to cover the interfacing region between 28, 28a and 30, 30a such that lips 38, 38a and 40, 40a are in abutting relation. Here, the circuit board support slots may be used to support circuit boards at a centrally located point along sides of the enclosure and conventional supports, such as standoffs, used to support the boards along front and back regions of upper or lower covers 12 and 12a.

For fastening the enclosure together, openings 46 and 48 in regions 34 and 36 may be provided, which openings are alignable with openings 50 and 50a provided in the side regions of covers 12 and 12a. Likewise, openings 46a and 48a in regions 34a and 36a are alignable with openings 51 and 51a in side regions of covers 12 and 12a. Openings 46, 48, 46a, and 48a are disposed to receive machine screws or self-tapping screws or to receive other types of fasteners, such as rivets. Additionally, in contrast to some of the prior art enclosures, since EMI radiation inside the enclosure of the present invention is blocked by overlapping joints, these fasteners are utilized strictly for assembly of the enclosure and not for grounding of EMI radiation, as is commonly done by such prior art by utilizing screw fasteners every inch or so.

During assembly, top 12 and bottom 12a are fitted together as shown in FIG. 2, with tabs 32 and 32a positioned snugly over the interior surface of depending regions 28a and 30. As such, narrow edges 29 and 29a and corresponding narrow edges of sides 30a and 30 (not shown) are brought together to form a butt joint centrally covered by tabs 32 and 32a. The front cover 16 and back cover 16a are installed such that extending regions 34 and 36 of front cover 16 and extending regions 34a and 36a of back cover 16a are positioned against interior surfaces of depending regions 28, 30, and 28a and 30a, with lips 38, 40, and 38a, 40a being in abutting relation with narrow edges 52, 54 and 52a and 54a (FIG. 1) of tabs 32 and 32a, respectively. Segmented upper and lower lips 42 and 44 of front cover 16 and segmented lips 42a and 44a of back cover 16a are positioned against respective interior surfaces of top cover 12 and bottom cover 12a, with any gap existing between lips 42, 44, and 42a, 44a and respective interior surfaces of upper and lower covers 12 and 12a being eliminated by the 2° outward inclination of these lips. Additionally, any gaps due to bowing or other unevenness of the upper and lower covers 12 and 12a are eliminated by segments 45 conforming to the uneven regions. Circuit boards 43 (dotted lines in FIG. 2) are mounted in and held in place by slots 39, 41, and 39a and 41a. Fasteners, such as screw 47 (only one shown), are then inserted through the openings therefor and operated to secure the components together.

Assembled as such, the butt joint between regions 28, 28a and 30, 30a is covered by tabs 32 and 32a and, inwardly extending regions 34, 36, and 34a, 36a, with these last-named regions extending to abut against edges 52, 54 and 52a, 54a of tabs 32 and 32a, respectively. Any small opening that may exist between tabs 32, 32a and lips 34, 36, and 34a, 36a is covered by small tabs 49, 53, and 49a and 53a. Thus, along this butt joint, high-frequency radiation is prevented from escaping from the enclosure by these overlapping joints. Along the front and rear surfaces of enclosure 10, the broad, overlapping surfaces of regions 34, 36, and 34a and 36a contacting inner sides of regions 28, 28a and 30, 30a prevent radiation from escaping from sides of these front regions. Likewise, segmented lips 42, 44, and 42a and 44a contacting and overlapping interior upper and lower surfaces of covers 12 and 12a prevent radiation from escaping from these joints.

Having thus described our invention and the manner of its use, it is apparent that incidental changes may be made thereto that fairly fall within the scope of the following appended claims, wherein we claim:

1. An enclosure for housing and supporting electronic circuit boards and for providing shielding from electromagnetic interference comprising:

an upper cover constructed of electromagnetic radiation shielding material and having an upper, generally flat surface and opposed downwardly depending side regions generally normal to said upper surface, said opposed downwardly depending side regions forming upper portions of sides of the enclosure;

a lower cover constructed of EMI shielding material and symmetrical to said upper cover and having a lower, generally flat surface and opposed upwardly depending side regions generally normal to said lower cover and being in abutting relation with said downwardly depending side regions of said upper cover and forming a butt joint between said upwardly depending side regions and said downwardly depending side regions, said upwardly depending side regions forming lower portions of said sides of said enclosure;

a front cover constructed of EMI shielding material and having a front, generally flat surface and first opposed side regions extending inward generally normal to said front surface, said first side regions disposed for covering at least a front, interior portion of said butt joint;

a rear cover constructed of EMI shielding material and symmetrical with said front cover and having a generally flat rear surface, and second opposed side regions extending inward generally normal to said rear surface, said second side regions disposed for covering at least a rear interior portion of said butt joint;

circuit board support means in said enclosure, for supporting at least one circuit board therein; and securing means for securing said front cover, said rear cover, said upper cover, and said lower cover together.

2. An enclosure as set forth in claim 1 wherein said securing means comprises first openings in said upwardly and downwardly depending side regions and alignable with second openings in said side regions of said front and rear covers, said first and second openings disposed in aligned relation for receiving fasteners for securing said front, rear, upper, and lower covers together.

3. An enclosure as set forth in claim 1 comprising a first plate affixed to one of said downwardly depending side regions and a second plate affixed to an opposite upwardly depending side region, said first and second plates positioned to cover a central, interior portion of said butt joint on each of said sides of said enclosure, said plate extending between and abutting against said first and second side regions.

4. An enclosure as set forth in claim 3 comprising an inwardly-turned first lip on each of said side regions of said front and rear covers, each said first lip being in abutting relation with end regions of said plates.

5. An enclosure as set forth in claim 4 wherein said support means comprises at least one slot in each of said first lips of said front and rear covers, with respective slots in each said first lip being horizontally aligned.

6. An enclosure as set forth in claim 3 comprising a second lip on each upper and lower edge of said front and rear covers, each said second lip being generally normal to said front surface and said rear surface of said front and rear covers, respectively, and engageable against interior surfaces of said upper and lower covers.

7. An enclosure as set forth in claim 6 wherein each said second lip is provided with a plurality of transverse slots for reducing stiffness of each said second lip and for providing lip segments engageable with interior surfaces of said upper and lower covers, eliminating any gap due to unevenness of said upper and lower covers.

8. An electromagnetic radiation-containing enclosure comprising:

an upper cover having opposed, downwardly depending side regions forming upper sides of said enclosure, said upper being cover constructed of a material for blocking electromagnetic radiation;

a lower cover symmetrical to said upper cover and having opposed, upwardly extending side regions forming lower sides of said enclosure, said lower cover being constructed of a material for blocking electromagnetic radiation, said downwardly depending side regions and said upwardly extending side regions forming a juncture therebetween along each of opposed sides of said enclosure, and said upper and lower covers further defining a front opening and a rear opening;

a front cover fitting within said front opening and having first opposed side regions each covering an interior front portion of a respective one of said junctures, said front cover of a material for blocking electromagnetic radiation;

a rear cover symmetrical to said front cover and fitting within said rear opening and having second opposed side regions, each covering an interior rear portion of a respective one of said junctures, said rear cover of a material for blocking electromagnetic radiation;

at least one circuit board support in said enclosure, for supporting at least one circuit board therein; and fasteners for securing said front cover, said rear cover, said upper cover, and said lower cover together, whereby all gaps in said enclosure which would otherwise permit electromagnetic radiation to escape are shielded.

9. An enclosure as set forth in claim 8 wherein said circuit board support further comprises a first, inwardly turned lip on each of said side regions of said front and rear covers, and at least one slot in each said lip, for providing support for said circuit board in each said slot.

10. An enclosure as set forth in claim 8 further comprising a first plate affixed to one of said downwardly depending upper side regions and a second plate affixed to a one of said upwardly extending lower side regions opposed from said last-named upper side region, said first and second plates being positioned to cover central regions of each said juncture between said first and second opposed side regions of said front and rear covers.

11. An enclosure as set forth in claim 9 further comprising a second lip on each upper and lower edge of said front and rear covers, each said lip being in contact with interior surfaces of said upper and lower covers.

* * * * *